United States Patent [19]
Li et al.

[11] Patent Number: 6,147,399
[45] Date of Patent: Nov. 14, 2000

[54] BACKSIDE EXPOSURE OF DESIRED NODES IN A MULTI-LAYER INTEGRATED CIRCUIT

[75] Inventors: Xia Li; Daniel Yim, both of Fremont, Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/148,666

[22] Filed: Sep. 4, 1998

[51] Int. Cl.$^7$ .................................................. H01L 23/053
[52] U.S. Cl. ........................... 257/700; 257/48; 257/692; 257/686; 257/748; 438/18
[58] Field of Search .................................... 257/700, 686, 257/692, 748, 48; 438/18

[56] References Cited

U.S. PATENT DOCUMENTS 5,767,578  6/1998  Chang et al. ............................ 257/717
5,990,562  11/1999  Vallett ....................................... 257/774

*Primary Examiner*—Cathy F. Lam
*Attorney, Agent, or Firm*—Sawyer Law Group LLP

[57] ABSTRACT

Aspects for exposing local areas for desired nodes in a multi-layer integrated circuit from the backside are described. In an exemplary method aspect, the method includes removing a predetermined portion of a first backside layer, opening chosen local areas with focused ion beam etching through at least the first backside layer, and exposing a desired node in a metal layer lower than the first backside layer with reactive ion etching. The method further includes removing the predetermined portion by performing reactive ion etching to a predetermined stop point. Alternatively, the first backside layer is mechanically polished to a predetermined thickness. Additionally, the method includes utilizing a high current ion beam during the focused ion beam etching.

6 Claims, 2 Drawing Sheets

BACKSIDE EXPOSURE OF DESIRED NODES IN A MULTI-LAYER INTEGRATED CIRCUIT

FIELD OF THE INVENTION

The present invention relates to multi-layer integrated circuit (IC) devices, and more particularly to exposure of desired nodes within a multi-layer integrated circuit device from a backside of the device.

BACKGROUND OF THE INVENTION

Bringing up lower level metal nodes of multi-layered IC devices is necessary for IC device modification or re-routing, as well as being useful for debugging and failure analysis. The task of bringing up these lower level metal nodes is often difficult and tedious, especially when desired or target metal nodes or layers are buried under other higher level or non-target metal nodes or layers. As a result, not only are target nodes difficult to access, but also, undesired shorts are difficult to prevent. To further complicate the situation, as the number of metal layers increases, the lower level metal nodes become increasingly thinner, and the node population becomes increasingly more dense. These conditions result in a decreased success rate reaching a desired lower level metal node.

Problems reaching desired metal nodes are exacerbated when there is limited frontside access, such as in flip-chip, multi-layer IC devices. FIG. 1 illustrates a sideview of a portion of a typical flip-chip configuration. As shown in FIG. 1, an IC device 10 is coupled to a ceramic package 12 (e.g., a C4 package) via solder bump 14. The solder bump 14 acts as a chip-to-carrier interconnect to attach the IC device 10 to the ceramic package 12 and to mate with corresponding pad patterns to form the necessary electrical contacts between the circuit(s) of the IC device 10 and pins of the package 12. To reach the desired nodes of the IC device 10, the thick silicon substrate 16, e.g., on the order of 530 microns ($\mu$m) thick, which is the top layer seen from the backside of the IC device 10, must be removed.

A common approach to reduce the silicon thickness is to utilize mechanical polishing of the device. The mechanical polishing used from the backside removes the silicon and creates a very thin device. The reduced thickness allows utilization of an infrared (IR) optical device to view the device, while performing some diagnostic analysis on device functionality. Unfortunately, the thin device created by polishing is difficult to handle and subsequently utilize in further device analysis, which normally requires the removal of the device from the package to perform more testing and inspection from the frontside of the device. Breakage of the device often occurs due to the thinness of the device and brittleness of the silicon. Thus, the process is highly problematic and significantly time-consuming.

Alternatively, RIE (reactive ion etching) is generally used as a global delayering method. In RIE, a frontside plasma etch normally removes passivation layers and dielectric layers to expose the metal layers of all the transistors in a given device. But, difficulties exist in utilizing RIE from the backside. While the techniques of RIE are established for frontside etching with stop points well-defined and understood, backside etching is less established. Thus, RIE is not considered an optimal technique for accessing nodes from the backside, especially since attempts to achieve a non-uniform etching in which only desired portions of a device are exposed may result in over-etch problems.

Another possibility is the utilization of a FIB (focused ion beam) system. With FIB utilization from the frontside, individual areas are exposed through the use of a focused ion beam. FIB techniques normally use a low level current, i.e., less than about 1000 picoamperes (pA), to open individual areas, e.g., windows of approximately 15 micron ($\mu$m)×15 $\mu$m. Unfortunately, such low levels of current result in significantly long time periods to open the windows, for example, on the order of thirty minutes per window. Further, when the FIB is used for desired nodes in lower levels, if the FIB window is not opened wide enough, the depth of the trench formed by etching through the upper layers limits the detection of a signal coming back from the node during e-beam (electron beam) probing. Normally, the desired aspect ratio (ratio of height to width) of the trench is 1:1, which is difficult to achieve in the lower level nodes due to the narrow width and increased depth of the trenches. These problems are even more significant from the backside, since the use of the FIB to etch through the thick silicon layer on the backside is considered highly time-consuming and thus is usually avoided. While a specially designed FIB exists for quick removal of bulk silicon material, such a FIB is expensive and limited to use on the backside. Thus, it does not provide a practical solution for most environments.

Accordingly, a need exists for exposing desired nodes at local areas from the backside efficiently and accurately for IC devices utilized in package orientations that limit frontside access. The present invention addresses such a need.

SUMMARY OF THE INVENTION

The present invention provides for exposure of local areas for desired nodes from the backside in multi-layer integrated circuits oriented with limited frontside access. In an exemplary method aspect, the method includes removing a predetermined portion of a first backside layer, opening chosen local areas with focused ion beam etching through at least the first backside layer, and exposing a desired node in a metal layer lower than the first backside layer with reactive ion etching. The method further includes removing the predetermined portion by performing reactive ion etching to a predetermined stop point. Alternatively, the first backside layer is mechanically polished to a predetermined thickness. Additionally, the method includes utilizing a high current ion beam during the focused ion beam etching.

Through the present invention, efficient node exposure is achieved for devices with limited frontside access from the backside. The present invention achieves effective node access while avoiding problems associated with device removal for frontside node access by utilizing local and global delayering techniques. These and other advantages of the aspects of the present invention will be more fully understood in conjunction with the following detailed description and accompanying drawings.

DETAILED DESCRIPTION

The present invention relates to exposing desired nodes from a backside in multi-layer integrated circuit devices with limited frontside access. The following description is presented to enable one of ordinary skill in the art to make and use the invention and is provided in the context of a patent application and its requirements. Various modifications to the preferred embodiment and the generic principles and features described herein will be readily apparent to those skilled in the art.

For illustrative purposes, exposure of a desired node at a local area in accordance with the present invention is described with reference to an overall flow diagram of processing steps shown in FIG. 2 in conjunction with FIGS. 3, 4, 5, and 6 which illustrate partial cross-sectional views of an example flip-chip, multi-layer integrated circuit during the steps of the processing. It should be appreciated that although the following description refers to flip-chip package orientations, this is meant as illustrative of one type of package orientation with limited frontside access. The aspects of the present inventions are suitable with other package orientations with limited frontside access to IC devices, including CSPs (chip scale packages).

Figure 1:
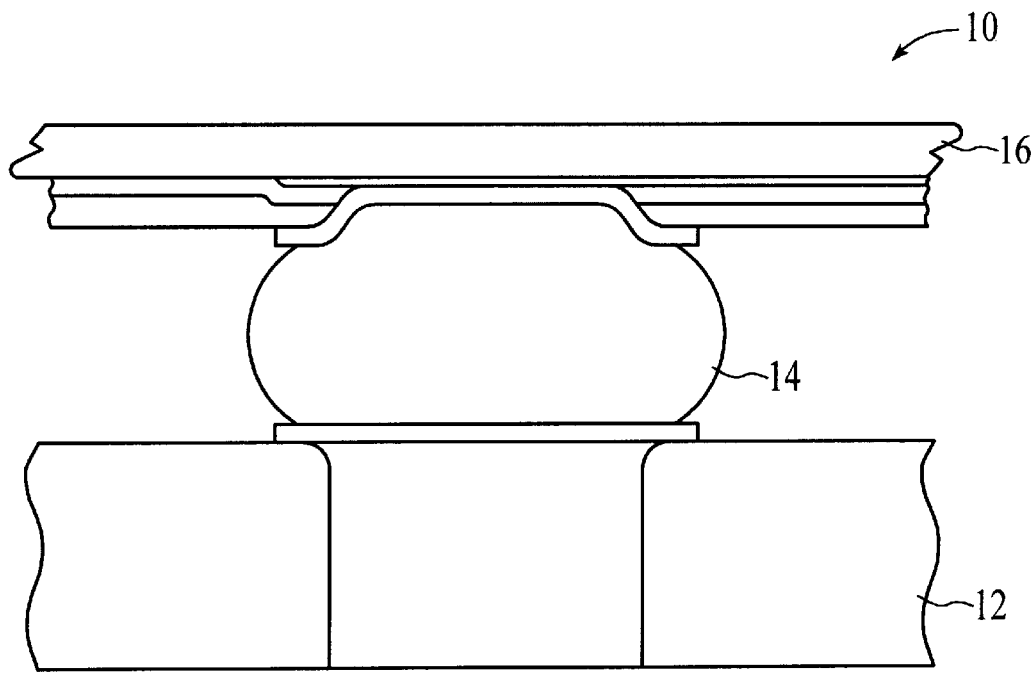
FIG. 1 illustrates a representation of a sideview of a portion of a typical flip-chip multi-layer integrated circuit.
Figure 2:
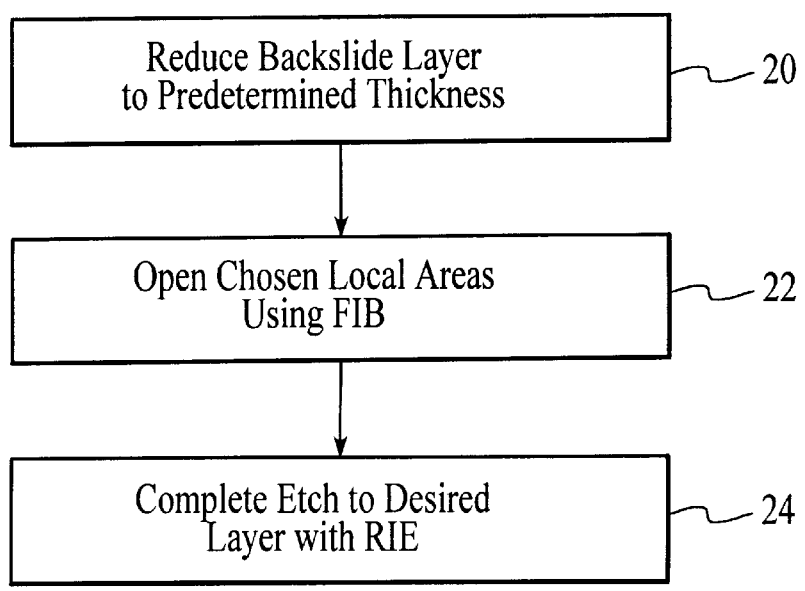
FIG. 2 illustrates a flow diagram of device delayering and analysis from a backside of an IC in accordance with an exemplary embodiment of the present invention.
Figure 3:
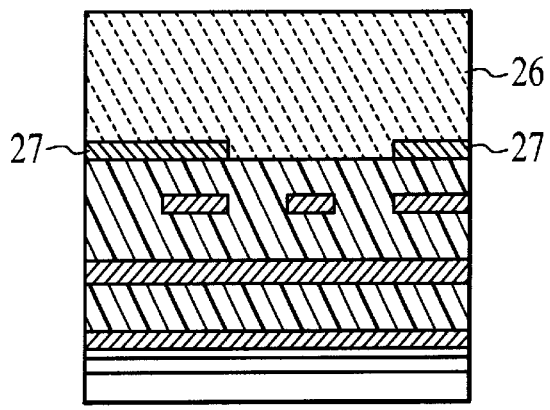
FIG. 3 illustrates a partial cross-section of a flip-chip device.
Figure 4:
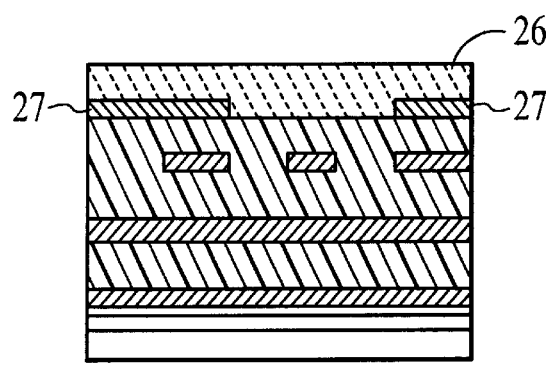
FIG. 4 illustrates a partial cross-section of the flip-chip device of FIG. 3 following step 20 of FIG. 2.

FIG. 2 illustrates a block flow diagram of a process for exposing desired nodes from a backside. FIG. 3 illustrates a partial cross-section of an example flip-chip device prior to the processing of FIG. 2. As shown in FIG. 3, a first layer encountered from the backside is a thick silicon layer 26, followed by active region areas 27. Thus, the process initiates with reducing a first backside layer to a predetermined thickness (step 20, FIG. 2). In a preferred embodiment, RIE is utilized according to an RIE etching recipe for silicon to reduce the thickness of the silicon, until a stop point, e.g., a desired thickness is reached. Suitably, the thickness of the silicon is reduced from about 530 $\mu$m to about 100 $\mu$m, with the stop point determined based on a particular time period for a given etch rate, as is well understood by those skilled in the art. Alternatively, the reduction utilizes mechanical polishing to remove a bulk of the backside layer. FIG. 4 illustrates the flip-chip device of FIG. 3 following step 20.

Figure 5:
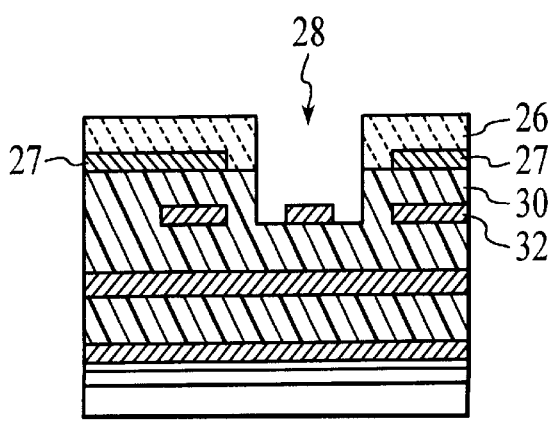
FIG. 5 illustrates a partial cross-section of the flip-chip device of FIG. 3 following step 22 of FIG. 2.

Desired selective areas are then suitably exposed using FIB techniques (step 22) to remove remaining backside layer material and reach interlayer dielectric (ILD)) material, e.g., silicon dioxide ($SiO_2$), of at least one metal layer. In a preferred embodiment, a higher than typical current is utilized during the FIB etching, e.g., greater than at least about 2700 pA, to perform isolated exposure of desired node areas in less time than normal FIB techniques. The chosen areas for FIB opening are preferably selected at locations under the non-active transistor region, so that FIB etching will not have impact on the device functionality. With the use of a higher beam current, significantly less time is needed to open a window in the IC using the FIB, e.g., around 5 minutes per window. The ion beam source is suitably a gallium ion beam provided at about 30 keV (kiloelectro Volts). Preferably, the FIB is utilized successively in different areas for the varying nodes being accessed. FIG. 5 illustrates a partial cross-section of the flip-chip device with a window 28 opened through layer 26, ILD layer 30, and exposed metal layer 32, via the FIB etching.

Figure 6:
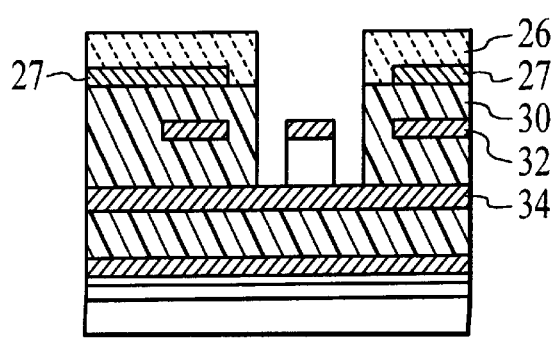
FIG. 6 illustrates a partial cross-section of the flip-chip device of FIG. 3 following step 24 of FIG. 2.

Once the local areas are opened, a bulk delayering occurs to the desired node metal layer using RIE (step 24). Preferably, a standard RIE etching recipe for removing ILD material, e.g., silicon dioxide, is utilized to remove a first ILD layer above the desired metal node. FIG. 6 illustrates a partial cross-section of the flip-chip device following exposure to the desired node, metal layer 34, through the remaining portion of ILD layer 30. The silicon remaining over the device outside of the exposed local areas effectively acts as a mask during the global delayering step 24, although a minimal amount of silicon may be removed when the ILD material is etched.

Although the present invention has been described in accordance with the embodiments shown, one of ordinary skill in the art will recognize that there could be variations to the embodiment and those variations would be within the spirit and scope of the present invention. For example, although the present invention has been described in terms of silicon based ICs, ICs formed with other substrates may be processed using suitable processing conditions for those substrates in accordance with the exposure methods described herein. Accordingly, many modifications may be made by one of ordinary skill without departing from the spirit and scope of the present invention, the scope of which is defined by the following claims.

What is claimed is:

1. A multi-layer integrated circuit structure with limited frontside access and having one or more exposed nodes, the structure comprising:

a first backside layer;

at least one lower level metal layer; and at least one interdielectric layer between the first backside layer and the at least one lower level metal layer, wherein exposure of a desired node of the at least one lower level metal layer results from reducing the first backside layer to a predetermined thickness, exposing at least one local area window through at least the first backside layer for at least one desired node, and etching to the at least one desired node through the at least one local area window by global delayering.

2. The structure of claim 1 wherein the first backside layer comprises a silicon layer.

3. The structure of claim 1 wherein reducing the first backside layer further comprises utilizing reactive ion etching.

4. The structure of claim 1 wherein reducing the first backside layer further comprises utilizing mechanical polishing.

5. The structure of claim 1 wherein exposing at least one local area window further comprises utilizing a high current focused ion beam.

6. A multi-layer integrated circuit structure with limited frontside access and having one or more exposed nodes, the structure comprising:

a first backside layer;

at least one lower level metal layer; and at least one interdielectric layer between the first backside layer and the at least one lower level metal layer, wherein exposure of a desired node of the at least one lower level metal layer results from reducing the first backside layer to a predetermined thickness, exposing at least one local area window through at least the first backside layer for at least one desired node, and etching to the at least one desired node through the at least one local area window by global delayering including reactive ion etching through the at least one dielectric layer.

* * * * *